United States Patent
Tao et al.

[11] Patent Number: 6,130,167
[45] Date of Patent: Oct. 10, 2000

[54] METHOD OF PREVENTING CORROSION OF A METAL STRUCTURE EXPOSED IN A NON-FULLY LANDED VIA

[75] Inventors: Hun-Jan Tao, Hsinchu; Shu-Chin Yang, Tai-Chung; Chao-Cheng Chen, Matou, all of Taiwan

[73] Assignee: Taiwan Semiconductor Manufacturing Company, Hsin-Chu, Taiwan

[21] Appl. No.: 09/270,593

[22] Filed: Mar. 18, 1999

[51] Int. Cl.[7] .................................................. H01L 21/308
[52] U.S. Cl. ........................ 438/710; 438/700; 438/725; 438/637; 438/618
[58] Field of Search .................................... 438/618, 624, 438/734, 709, 710, 725, 700, 637

[56] References Cited

U.S. PATENT DOCUMENTS

| | | | |
|---|---|---|---|
| 4,287,661 | 9/1981 | Stoffel | 29/571 |
| 4,501,061 | 2/1985 | Wonnacott | 29/591 |
| 5,397,432 | 3/1995 | Konno et al. | 156/665 |
| 5,451,293 | 9/1995 | Tabara | 216/3 |
| 5,741,741 | 4/1998 | Tseng | 438/637 |
| 5,792,728 | 8/1998 | Chan et al. | 438/6 |
| 5,849,640 | 12/1998 | Hsia et al. | 438/734 |
| 5,858,878 | 1/1999 | Toda | 438/725 |
| 5,930,676 | 7/1999 | Noda et al. | 438/672 |
| 5,962,345 | 10/1999 | Yen et al. | 438/709 |
| 5,976,984 | 11/1999 | Chen et al. | 438/700 |
| 6,063,709 | 5/2000 | Kuo et al. | 438/710 |

OTHER PUBLICATIONS

Chang et al., "VLSI Technology", The McGraw–Hill Companies, Inc., NY, 1996, p. 360.

*Primary Examiner*—Matthew Smith
*Assistant Examiner*—V. Yevsikov
*Attorney, Agent, or Firm*—George O. Saile; Stephen B. Ackerman

[57] ABSTRACT

A process used to prevent attack of an aluminum based structure, exposed in a non-fully landed via hole, from solvents used during the wet stripping cycle, performed to remove the via hole defining photoresist shape, has been developed. The process features the formation of a protective aluminum oxide layer, on the exposed side of the aluminum based structure, via use of a plasma treatment, performed in an $H_2O/N_2$ ambient. The $H_2O/N_2$ plasma treatment procedure is performed after a dry plasma, photoresist stripping step, but prior to a final wet photoresist stripping step. The aluminum oxide layer offers protection of the exposed regions of the aluminum structure, located in the non-fully landed via hole, from reaction or corrosion, that can result from exposure of aluminum to the solvents used in the final wet photoresist stripping cycle.

20 Claims, 3 Drawing Sheets

METHOD OF PREVENTING CORROSION OF A METAL STRUCTURE EXPOSED IN A NON-FULLY LANDED VIA

BACKGROUND OF THE INVENTION (1) Field of the Invention

The present invention relates to methods used to fabricate semiconductor devices, and more specifically to a method used to protect metal interconnect structures, exposed during photoresist stripping procedures.

(2) Description of Prior Art

The use of low dielectric constant materials, such as a hydrogen silsesquioxane, (HSQ), used as interlevel dielectric layers, in semiconductor devices, offers reduced capacitance, and therefore improved device performance, when compared to higher dielectric constant materials, such as silicon oxide. The HSQ layer, featuring a dielectric constant of about 2.8 to 3.0, is sometimes covered with a thin silicon oxide layer, used as a hard mask, offering protection to the HSQ layer during conventional semiconductor fabrication procedures, such as dry etching and photoresist stripping. However when a via hole is formed in the composite insulator layer, comprised of silicon oxide, on HSQ, the sides of the HSQ still remain exposed to subsequent processing, such as a final wet strip, used to remove the defining photoresist pattern. This can result in solvent being trapped in the HSQ layer, with subsequent processing allowing outgassing of the trapped solvent, possibly inducing corrosion of an adjacent aluminum based metal structure, exposed in the newly formed via hole.

In addition to trapped solvents in HSQ layers, resulting from a wet strip of a defining photoresist shape, these same solvents can directly attack, and corrode, exposed aluminum based structures. This is evident when a non-fully landed, or an unlanded via hole, is formed, exposing a portion of an underlying aluminum based structure. An overlying barrier layer, such as titanium nitride, can only protect the top surface of the underlying aluminum based structure, from the wet strip solvents, however offering no protection of the exposed sides of the aluminum based structure, in the unlanded via hole. Therefore the exposed sides of the aluminum based structure, in the unlanded via hole, can be attacked by either outgassing of solvents, from the HSQ layer, during subsequent processing procedures, or attacked directly by these same solvents, during the photoresist wet strip procedure.

This invention will teach a process used to passivate, or protect the exposed surfaces of the aluminum based structure, from the solvents used for the final, wet strip process. The invention features the insertion of a $H_2O/N_2$ plasma procedure, between a photoresist dry removal step, and the photoresist wet stripping step. The $H_2O/N_2$ plasma treatment results in the growth of an $Al_2O_3$ layer, on the exposed sides of the aluminum based structure, as well as forming a passivating layer, on the sides of the exposed HSQ layer, thus resulting in protection of the aluminum based structure, during the photoresist wet strip procedure, as well as during subsequent processing procedures. Prior art, such as Chan et al, in U.S. Pat. No. 5,792,672, describe a $H_2O$ plasma treatment, followed by a dry strip procedure, used to remove the defining photoresist shape. That prior art however, does not use an initial dry strip, followed by the $H_2O/N_2$ plasma treatment, prior to the wet strip, essential when an HSQ surface, as well as an aluminum based surface, is exposed.

SUMMARY OF THE INVENTION

It is an object of this invention to create a non-fully landed via hole, in a composite insulator layer that is comprised of an overlying silicon oxide layer, and an underlying hydrogen silsesquioxane, (HSQ), layer, with a portion of an underlying aluminum based structure, exposed at the bottom of the non-fully landed via hole.

It is another object of this invention to grow an aluminum oxide layer, on the exposed sides of the aluminum based structure, in the non-fully landed, via hole, prior to a wet stripping step, used to remove the via hole defining, photoresist mask.

It is still another object of this invention to grow the aluminum oxide layer, on the exposed sides of the aluminum based structure, using a $H_2O/N_2$ plasma treatment, performed after a dry photoresist stripping cycle, and prior to the wet photoresist stripping cycle.

In accordance with the present invention a method of forming a non-fully landed via hole, in a composite insulator HSQ layer, exposing a portion of an underlying metal structure, is described. A composite insulator layer, comprised of an underlying HSQ layer, and an overlying silicon oxide layer, is formed on an underlying aluminum based structure. A photoresist shape is used as a mask to open a non-fully landed via hole, in the composite insulator layer, exposing the top surface, as well as a side, of the aluminum based structure. The removal of the masking photoresist shape is initiated via use of a dry, plasma oxygen ashing procedure, followed by an $H_2O/N_2$ plasma treatment, resulting in the formation of an aluminum oxide layer, on the side of the aluminum based metal structure, exposed in the non-fully landed via hole. A wet photoresist strip, is then used to complete the photoresist removal procedure, with the exposed sides of the aluminum based structure, and of the HSQ layer, passivated, and protected, from the solvents used during the wet photoresist strip procedure, as a result of the $H_2O/N_2$ plasma treatment.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of creating a non-fully landed via hole, in a composite insulator layer, to an underlying aluminum based structure, featuring the growth of an aluminum oxide layer, on the exposed sides of the aluminum based structure, during the procedure used to remove the via hole defining photoresist shape, is now described in detail. This invention is described featuring a non-fully landed via hole, exposing an aluminum based structure, however this invention can be used to create a non-fully landed via hole to other metal structures, comprised of refractory metals, or comprised with metal silicide layers. In addition this invention is described for creating a non-fully landed via hole in a composite insulator layer, featuring an underlying HSQ layer, however this invention can also be used to create a non-fully landed via hole in a single insulator layer, or in composite insulator layer, comprised without an underlying HSQ layer.

Figure 1:
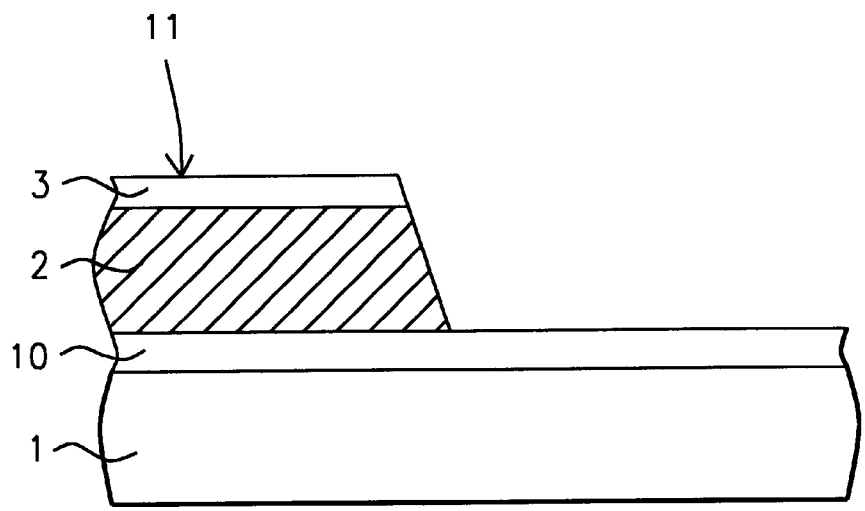
FIGS. 1–5, which schematically, in cross-sectional style, show the key stages of fabrication, used to create a non-fully landed via hole, in a composite insulator layer, to a underlying aluminum based structure.

FIG. 1, schematically shows a metal structure 11, on an insulator layer 10, with both metal structure 11, and insulator layer 10, located overlying a semiconductor substrate 1. Not shown in the drawings is where metal structure 11, overlays, and contacts, either an underlying, lower level interconnect structure, by means of a via hole in insulator layer 10, or contacts an active device region, in semiconductor substrate 1, by way of a contact hole in insulator layer 10. Insulator layer 10, can be comprised of silicon oxide, obtained via low pressure chemical vapor deposition, (LPCVD), or plasma enhanced chemical vapor deposition, (PECVD), procedures, at a thickness between about 8000 to 10000 Angstroms. Metal structure 11, is obtained via the deposition of an underlying aluminum based layer 2, obtained via R.F. sputtering, at a thickness between about 4000 to 5000 Angstroms, containing copper, at a weight percent of about 0.5 to 1.0%, followed by the deposition of an overlying titanium nitride layer 3, via R.F. sputtering, at a thickness between about 200 to 700 Angstroms. Conventional photolithographic and reactive ion etching, (RIE), procedures, using $Cl_2$ as an etchant, are used to create metal structure 11, comprised of overlying titanium nitride layer 3, and underlying aluminum based layer 2, on insulator layer 10. The photoresist shape, used to define metal structure 11, is removed via plasma oxygen ashing and careful wet cleans.

Figure 2:
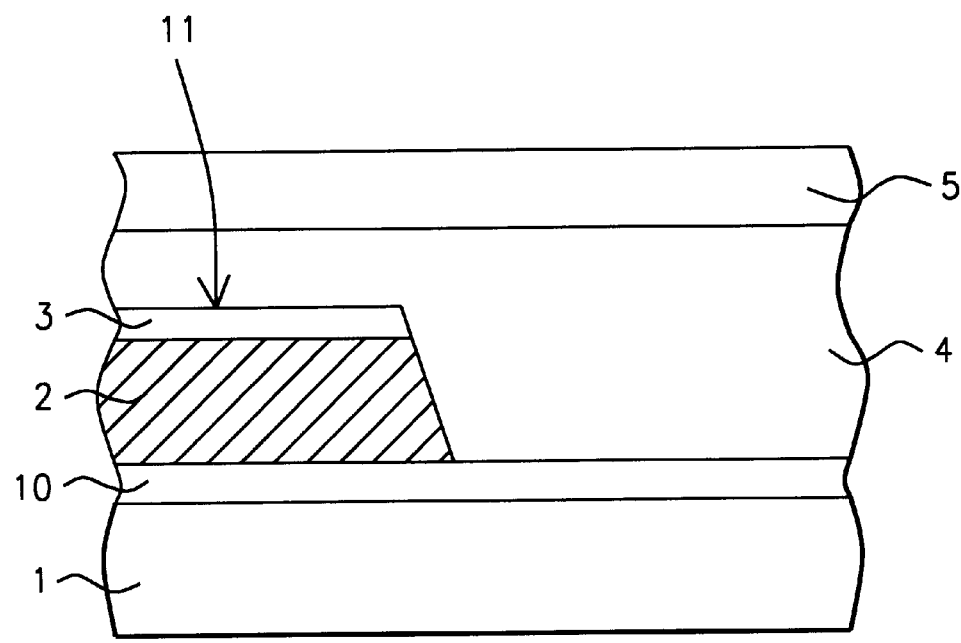

A composite insulator layer, shown schematically in FIG. 2, comprised of an underlying hydrogen silsesquioxane, (HSQ), layer 4, and an overlying silicon oxide layer 5, is next formed. HSQ layer 4, is applied via a spin-on procedure, to a thickness between about 3000 to 6000 Angstroms. The use of the HSQ layer, as a passivating layer, featuring a low dielectric constant between about 2.8 to 3.0, offers decreased capacitance, and thus enhanced device performance, when compared to counterpart devices fabricated with higher dielectric constant insulator materials. Overlying silicon oxide layer 5, obtained using LPCVD or PECVD procedures, at a thickness between about 2000 to 6000 Angstroms, is used to provide process compatibility with subsequent steps, and materials, such as an overlying, via hole defining photoresist shape, which would be difficult to form directly on HSQ layer 4.

Figure 3:
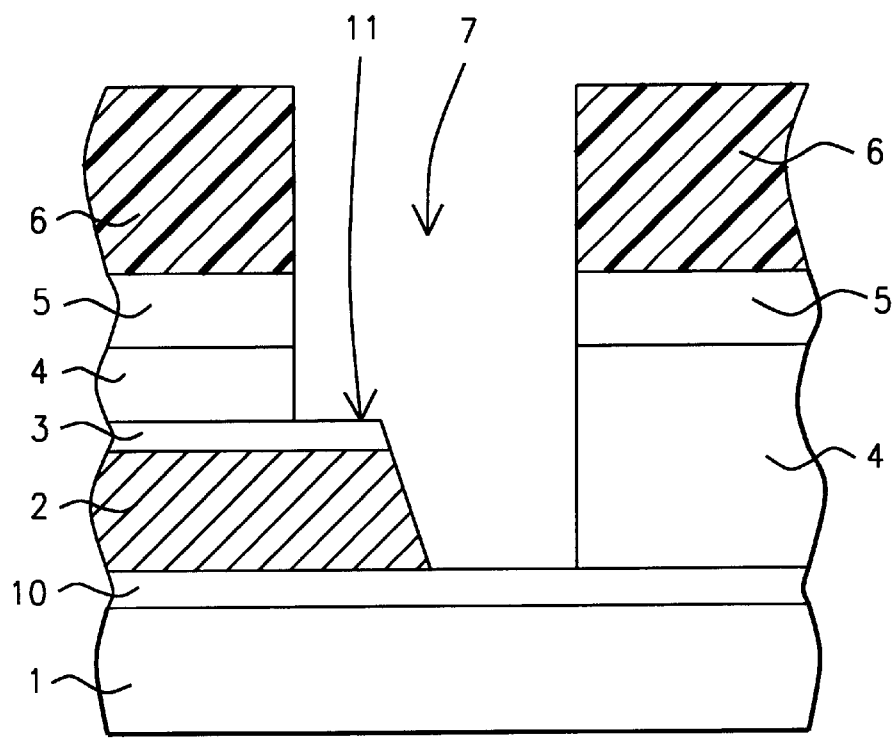

Photoresist shape 6, is next used as an etch mask, to define via hole 7, in the composite insulator layer, exposing a top portion of, as well as a side of, metal structure 11. This is shown schematically in FIG. 3. Via hole 7, formed using a $C_xF_y$ type etchant, such as $CF_4/CO/O_2$, for silicon oxide layer 5, while using a $C_xF_y$ type etchant, such as $CF_4/Ar$ for HSQ layer 4, is a non-fully landed via hole, or a via hole that is results in the exposure of a portion of the top surface of, as well as the exposure of a side of, underlying metal structure 11. This allows less area to be allotted for the via hole. If a fully landed via hole was used, increased device area would be consumed, to insure the fully landed, design groundrules, resulting in larger than desired, semiconductor chips. However the exposure of the side of metal structure 11, can result in metal corrosion during the wet stripping cycle, used to remove photoresist shape 6, at the conclusion of the opening of via hole 7. Corrosion of exposed regions of metal structure 11, an aluminum based structure, in this case, can occur as a result of the wet solvents being absorbed by exposed HSQ layer 4, followed by outgassing, and corrosion of exposed surfaces of the aluminum based structure, during subsequent processing procedures. In addition the corrosion of the exposed sides of the aluminum based structure, can also occur directly, via reaction of the exposed aluminum, and the solvents used during the wet strip cycle, of the photoresist removal procedure, applied to photoresist shape 6.

Figure 4:
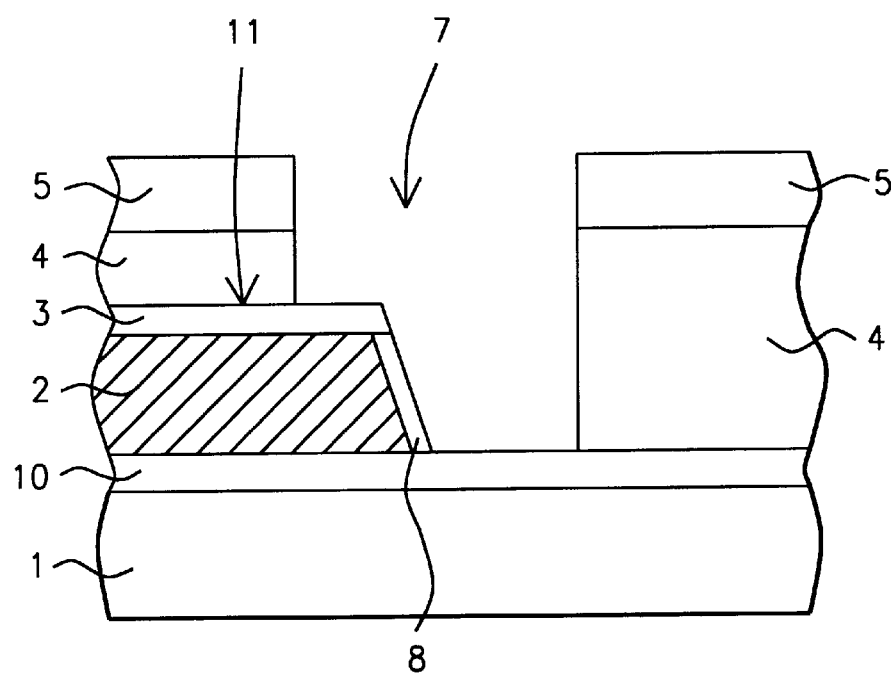

A process used to protect exposed surfaces of metal structure 11, during the procedure used to strip photoresist shape 6, is now described and schematically shown in FIG. 4. First a plasma oxygen ashing procedure, is used to remove the bulk of photoresist shape 6. Next a critical, plasma treatment, performed in a $H_2O/N_2$ ambient, is used to grow aluminum oxide layer 8, on the side of the aluminum based layer 2, of metal structure 11. Aluminum oxide layer 8, at a thickness between about 50 to 150 Angstroms, is obtained via the plasma treatment, at a power between about 500 to 2000 watts, at a pressure between about 0.5 to 5.0 torr, using between about 100 to 1000 sccm of $H_2O$, and between about 100 to 1000 sccm of $N_2$. This plasma treatment is performed at a temperature between about 20 to 300° C., for a time between about 10 to 120 sec. Aluminum oxide layer 8, resulting from the use of the $H_2O$ component, protects the sides of aluminum based layer 2, during a subsequent wet photoresist cycle, while the nitrogen component, used in the plasma treatment, results in the formation of a passivating layer, on the exposed sides of HSQ layer 4, thus preventing absorption of solvents, from the subsequent wet strip cycle, into the HSQ layer. A final wet strip procedure, performed using an amine solvent, such as ACT 690, at a temperature between about 100 to 120° C., is then used completely remove any organic residue remaining from photoresist shape 6. Again the final wet strip is performed without vulnerability to adjacent metal or insulator materials, as a result of the aluminum oxide growth, and formation of the passivating layer, formed on exposed surfaces, during the $H_2O/N_2$ plasma treatment cycle.

Figure 5:
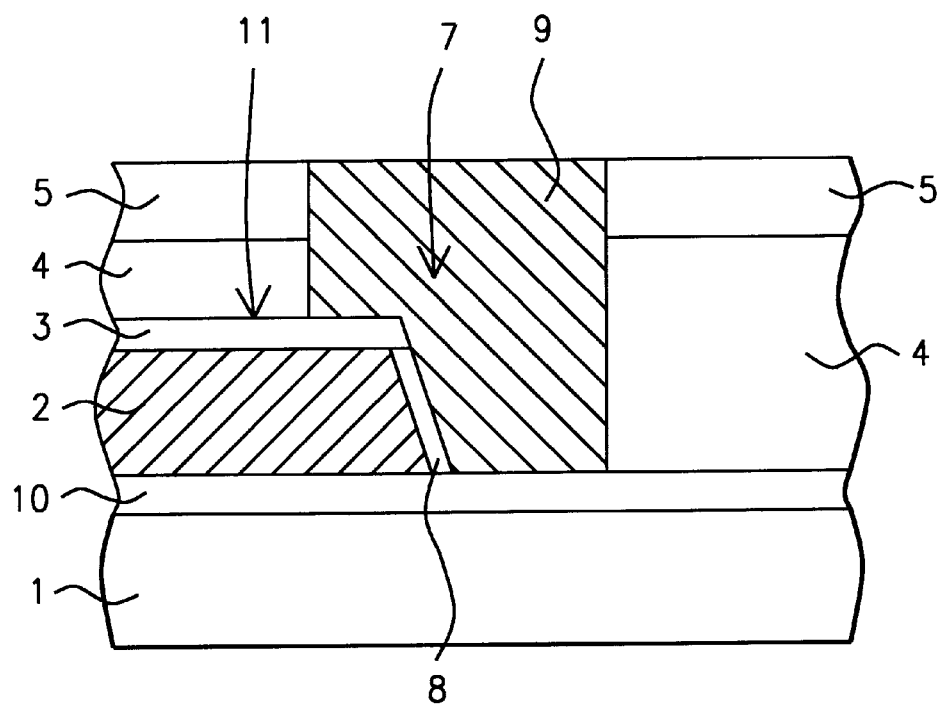

A metal structure 9, either a plug structure, or an upper level interconnect structure, comprised of a high conductivity metal such as copper, is next formed in non-fully landed via hole 7. This is shown schematically in FIG. 5. The deposition of the copper layer can be accomplished via R.F. sputtering, or via an electrochemical deposition procedure, followed by removal of unwanted copper, from the top surface of silicon oxide layer 5, for the copper plug option, via a selective RIE procedure, using $Cl_2$ as an etchant, or via a chemical mechanical polishing procedure. If an upper level, copper interconnect structure option is desired, conventional photolithographic and RIE procedures, are used. The copper structure physically and electrically, contacts the top surface of underlying metal structure 11, exposed in non-fully landed via hole 7.

While this invention has been particularly shown and described with reference to the preferred embodiment thereof, it will be understood by those skilled in the art that various changes in form and details may be made without departing from the spirit and scope of this invention.

What is claimed is:

1. A method of forming a via hole, in an insulator layer, on a semiconductor substrate, comprising the steps of:

providing a metal structure, located on a first insulator layer;

depositing a second insulator layer on said metal structure, and on the regions of said first insulator layer, not covered by said metal structure;

forming a photoresist shape, on the top surface of said second insulator layer, with an opening in said photoresist shape exposing an area of said second insulator layer that overlays a portion of underlying, said metal structure;

performing a dry etching procedure to the area of said second insulator layer, exposed in the opening in said photoresist shape, creating said via hole, in said second insulator layer, with said via hole exposing a portion of the top surface of said metal structure, and exposing a side of said metal structure;

performing a dry plasma stripping procedure to remove a top portion of said photoresist shape;

performing a $H_2O/N_2$ plasma treatment to create a metal oxide layer on said side of said metal structure, exposed in said via hole;

performing a wet stripping procedure, to remove a bottom portion of said photoresist shape; and forming an upper level metal structure, in said via hole, contacting said top surface of, and said side of, said metal structure.

2. The method of claim 1, wherein said metal structure is comprised of an underlying aluminum based layer, containing between about 0.5 to 1.0 weight percent copper, obtained via R.F. sputtering, at a thickness between about 4000 to 5000 Angstroms, and comprised of an overlying titanium nitride layer, obtained via R.F. sputtering, at a thickness between about 200 to 700 Angstroms.

3. The method of claim 1, wherein said second insulator layer, is a composite insulator layer, comprised of an underlying hydrogen silsesquioxane, (HSQ), layer, obtained via spin-on procedures to a thickness between about 3000 to 6000 Angstroms, and with a dielectric constant between about 2.8 to 3.0, and comprised of an overlying silicon oxide layer, obtained via LPCVD or PECVD procedures, to a thickness between about 2000 to 6000 Angstroms.

4. The method of claim 1, wherein said dry etching procedure, used to create said via hole, in said second insulator layer, is a RIE procedure, using a $C_xF_y$ type etchant, such as $CF_4/CO/O_2$ as an etchant for silicon oxide, and using a $C_xF_y$ type etchant, such as $CF_4/Ar$ as an etchant for the HSQ layer.

5. The method of claim 1, wherein said metal oxide layer, formed on the side of said metal structure, as a result of said $H_2O/N_2$ plasma treatment, is an aluminum oxide layer, formed to a thickness between about 50 to 150 Angstroms.

6. The method of claim 1, wherein said $H_2O/N_2$ plasma treatment is performed at a power between about 500 to 2000 watts, at a pressure between about 0.5 to 5.0 torr, at a temperature between about 20 to 300° C., and for a time between about 10 to 120 sec., using between about 100 to 1000 sccm of $H_2O$, and using about 100 to 1000 sccm of $N_2$.

7. The method of claim 1, wherein said wet stripping procedure is performed at a temperature between about 100 to 120° C.

8. A method of forming a non-fully landed via hole, in a composite insulator layer, to an underlying aluminum based structure, featuring the formation of an aluminum oxide layer, on a side of the aluminum based structure exposed in the non-fully landed via hole, during the removal of a photoresist shape, used to define the non-fully landed via hole, comprising the steps of:

forming said aluminum based structure, on an underlying insulator layer;

applying a hydrogen silsesquioxane, (HSQ), layer on said aluminum based structure, and on the region of said underlying insulator layer, not covered by said aluminum based structure;

depositing a silicon oxide layer on said HSQ layer, resulting in said composite insulator layer comprised of said silicon oxide layer, on said HSQ layer;

forming a photoresist shape on the top surface of said composite insulator layer, with an opening in said photoresist shape, exposing a region of said composite insulator layer that in turn overlays a portion of underlying, said aluminum based structure, as well as overlying a portion of said underlying insulator layer;

creating said non-fully landed via hole, in said composite insulator layer, using said photoresist shape, with said opening, as a mask, resulting in a portion of the top surface of, and a side of, said aluminum based structure, exposed in said non-fully landed via hole;

performing a dry stripping procedure, to remove a top portion of said photoresist shape;

performing an $H_2O/N_2$ plasma treatment to create said aluminum oxide layer, on the side of said aluminum based structure, exposed in said non-fully landed via hole;

performing a wet stripping procedure, to remove a bottom portion of said photoresist shape; and forming a copper structure, in said non-fully landed via hole.

9. The method of claim 8, wherein said aluminum based structure is comprised of an underlying layer of aluminum, containing between about 0.5 to 1.0 weight percent copper, obtained via R.F. sputtering procedures, to a thickness between about 4000 to 5000 Angstroms, and comprised of an overlying titanium nitride layer, obtained via R.F. sputtering, at a thickness between about 200 to 700 Angstroms.

10. The method of claim 8, wherein said HSQ layer is applied via a spin-on procedure, at a thickness between about 3000 to 6000 Angstroms, with said HSQ layer featuring a dielectric constant between about 2.8 to 3.0.

11. The method of claim 8, wherein said silicon oxide layer is obtained via LPCVD or PECVD procedures, at a thickness between about 2000 to 6000 Angstroms.

12. The method of claim 8, wherein said non-fully landed via hole is formed in said composite insulator layer, by means of a RIE procedure, using a $C_xF_y$ type etchant, such as $CF_4/CO/O_2$ as an etchant for said silicon oxide layer, and using a $C_xF_y$ type etchant, such as $CF_4/Ar$ as an etchant for said HSQ layer.

13. The method of claim 8, wherein said $H_2O/N_2$ plasma treatment procedure is performed at a power between about 500 to 2000 watts, at a pressure between about 0.5 to 5.0 torr, at temperature between about 20 to 300° C., for a time between about 10 to 120 sec., using between about 100 to 1000 sccm of $H_2O$, and using between about 100 to 1000 sccm of $N_2$.

14. The method of claim 8, wherein said aluminum oxide layer is formed at a thickness between about 500 to 150 Angstroms, during said $H_2O/N_2$ plasma treatment.

15. The method of claim 8, wherein said wet stripping procedure, used to remove the bottom portion of said photoresist shape, is performed at a temperature between about 100 to 120° C.

16. A method of forming a via hole, in an insulator layer, on a semiconductor substrate, comprising the steps of:

providing a metal structure, located on a first insulator layer;

depositing a second insulator layer on said metal structure, and on the regions of said first insulator layer, not covered by said metal structure;

defining a via hole photoresist pattern, on the top surface of said insulator layer;

etching the region of said second insulator layer, not covered by said photoresist pattern, to open said via hole, with said via hole exposing a portion of the top surface of said metal structure, and exposing a side of said metal structure;

forming a metal oxide layer, via a plasma treatment, on the side of said metal structure, exposed in said via hole; and removing said photoresist pattern.

17. The method of claim 16, wherein said metal structure is comprised of an underlying aluminum based layer, containing between about 0.5 to 1.0 weight percent copper, obtained via R.F. sputtering, at a thickness between about 4000 to 5000 Angstroms, and comprised of an overlying titanium nitride layer, obtained via R.F. sputtering, at a thickness between about 200 to 700 Angstroms.

18. The method of claim 16, wherein said second insulator layer, is a composite insulator layer, comprised of an underlying hydrogen silsesquioxane, (HSQ), layer, obtained via spin-on procedures to a thickness between about 3000 to 6000 Angstroms, and with a dielectric constant between about 2.8 to 3.0, and comprised of an overlying silicon oxide layer, obtained via LPCVD or PECVD procedures, to a thickness between about 2000 to 6000 Angstroms.

19. The method of claim 16, wherein said metal oxide layer, formed on the side of said metal structure, as a result of said $H_2O/N_2$ plasma treatment, is an aluminum oxide layer, formed to a thickness between about 50 to 150 Angstroms.

20. The method of claim 16, wherein said plasma treatment is an $H_2O/N_2$ plasma treatment, performed at a power between about 500 to 2000 watts, at a pressure between about 0.5 to 5.0 torr, at a temperature between about 20 to 300° C., and for a time between about 10 to 120 sec., using between about 100 to 1000 sccm of $H_2O$, and using about 100 to 1000 sccm of $N_2$.

* * * * *